(12) United States Patent
Qu et al.

(10) Patent No.: US 11,980,079 B2
(45) Date of Patent: May 7, 2024

(54) ARRAY SUBSTRATE, DISPLAY PANEL, DISPLAY APPARATUS, AND METHOD FOR MANUFACTURING THE ARRAY SUBSTRATE

(71) Applicant: BOE TECHNOLOGY GROUP CO., LTD., Beijing (CN)

(72) Inventors: Caiyu Qu, Beijing (CN); Yanjun Hao, Beijing (CN); Hao Liu, Beijing (CN); Zunqing Song, Beijing (CN); Dong Li, Beijing (CN); Huijuan Zhang, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 102 days.

(21) Appl. No.: 17/755,268

(22) PCT Filed: Mar. 9, 2021

(86) PCT No.: PCT/CN2021/079642
§ 371 (c)(1),
(2) Date: Apr. 25, 2022

(87) PCT Pub. No.: WO2022/188016
PCT Pub. Date: Sep. 15, 2022

(65) Prior Publication Data
US 2023/0172025 A1 Jun. 1, 2023

(51) Int. Cl.
*H10K 59/40* (2023.01)
*G06V 40/13* (2022.01)
(Continued)

(52) U.S. Cl.
CPC ......... *H10K 59/40* (2023.02); *G06V 40/1306* (2022.01); *H10K 59/1201* (2023.02);
(Continued)

(58) Field of Classification Search
CPC .. H10K 59/40; H10K 59/1201; H10K 59/131; H10K 59/179; H10K 59/12;
(Continued)

(56) References Cited

U.S. PATENT DOCUMENTS 9,940,500 B2 4/2018 Liu et al.
10,719,680 B2 7/2020 Ye
(Continued)

FOREIGN PATENT DOCUMENTS

CN 104881196 A 9/2015
CN 107748874 A 3/2018
(Continued)

OTHER PUBLICATIONS

English Translation of International Search Report dated Nov. 26, 2021, for corresponding PCT Application No. PCT/CN2021/079642.

*Primary Examiner* — Abhishek Sarma
(74) *Attorney, Agent, or Firm* — Kinney & Lange, P.A.

(57) ABSTRACT

An array substrate, a display panel, a display apparatus, and a method for manufacturing the array substrate are provided. The array substrate includes: a base substrate; a plurality of pixels, at least one of the pixels including a pixel driver circuit and a light-emitting unit electrically connected to the pixel driver circuit; a fingerprint recognition structure including a first capacitor electrode configured to form a capacitor for fingerprint recognition between at least a part of a touch body and the first capacitor electrode in response to the at least a part of the touch body covering the first capacitor electrode. The fingerprint recognition structure is in the at least one pixel, the pixel driver circuit includes a thin film transistor including an active layer and a gate, and the first capacitor electrode is in the same layer as one of the active layer or the gate of the thin film transistor.

19 Claims, 9 Drawing Sheets

(51) Int. Cl.
  *G09G 3/3233* (2016.01)
  *H10K 59/12* (2023.01)
  *H10K 59/131* (2023.01)
  *H10K 59/179* (2023.01)

(52) U.S. Cl.
  CPC ... *G09G 3/3233* (2013.01); *G09G 2300/0819* (2013.01); *G09G 2300/0842* (2013.01); *G09G 2300/0861* (2013.01); *G09G 2354/00* (2013.01); *H10K 59/131* (2023.02); *H10K 59/179* (2023.02)

(58) Field of Classification Search
  CPC ............ G06V 40/1306; G09G 3/3233; G09G 2300/0819; G09G 2300/0842; G09G 2300/0861; G09G 2354/00; G06F 3/044; G06F 3/0445
  See application file for complete search history.

(56) References Cited

U.S. PATENT DOCUMENTS

| | | |
|---|---|---|
| 2017/0147850 A1 | 5/2017 | Liu et al. |
| 2020/0082142 A1 | 3/2020 | Ye |
| 2021/0365656 A1 | 11/2021 | Xu et al. |
| 2022/0043995 A1* | 2/2022 | Song ............... G06F 3/0412 |
| 2022/0165780 A1* | 5/2022 | Geng ............. G06V 40/1394 |

FOREIGN PATENT DOCUMENTS

| | | |
|---|---|---|
| CN | 107749419 A | 3/2018 |
| CN | 107819018 A | 3/2018 |
| CN | 107908034 A | 4/2018 |
| CN | 107946346 A | 4/2018 |
| CN | 208903234 U | 5/2019 |
| CN | 110008929 A | 7/2019 |
| CN | 110929667 A | 3/2020 |
| JP | 5732317 B2 | 4/2015 |

* cited by examiner

ARRAY SUBSTRATE, DISPLAY PANEL, DISPLAY APPARATUS, AND METHOD FOR MANUFACTURING THE ARRAY SUBSTRATE

CROSS-REFERENCE TO RELATED APPLICATION

This application is a Section 371 National Stage Application of International Application No. PCT/CN2021/079642, filed on Mar. 9, 2021, entitled "ARRAY SUBSTRATE, DISPLAY PANEL, DISPLAY APPARATUS, AND METHOD FOR MANUFACTURING THE ARRAY SUBSTRATE", incorporated herein by reference in its entirety.

TECHNICAL FIELD

The present disclosure relates to a field of display technology, and in particular to an array substrate, a display panel, a display apparatus, and a method for manufacturing the array substrate.

BACKGROUND

Due to the uniqueness of the fingerprint pattern, a fingerprint may be recognized by comparing details of different fingerprints, thereby realizing functions such as identity authentication and privacy protection. With the development of technology, fingerprint recognition technology is widely applied to various terminal devices such as a display apparatus. For example, the terminal devices include various types of fingerprint recognition technologies such as the capacitive fingerprint recognition technology, the optical fingerprint recognition technology, and the ultrasonic fingerprint recognition technology. In this way, integrating the above-mentioned at least one type of fingerprint recognition technology into the various terminal devices such as a display apparatus has gradually become an important issue that research and development personnel pay attention to.

It should be noted that the information disclosed in the above Background section is only for enhancing understanding of the background of the present disclosure, and thus may include information that does not form the prior art known to those skilled in the art.

SUMMARY

In one aspect, an array substrate is provided, including: a base substrate; a plurality of pixels arranged on the base substrate, where the plurality of pixels are arranged on the base substrate in an array, and at least one of the plurality of pixels includes a pixel driver circuit and a light-emitting unit electrically connected to the pixel driver circuit; and a fingerprint recognition structure, the fingerprint recognition structure including a first capacitor electrode configured to form a capacitor for fingerprint recognition between at least a part of a touch body and the first capacitor electrode in response to the at least a part of the touch body covering the first capacitor electrode, where the fingerprint recognition structure is in the at least one pixel, the pixel driver circuit includes a thin film transistor, the thin film transistor includes an active layer and a gate, and the first capacitor electrode is in the same layer as one of the active layer of the thin film transistor or the gate of the thin film transistor.

According to some embodiments, the first capacitor electrode is on a side of the light-emitting unit close to the base substrate.

In some embodiments, the array substrate includes a plurality of fingerprint recognition structures, and the plurality of fingerprint recognition structures are arranged in the plurality of pixels, respectively.

In some embodiments, the base substrate includes a first surface away from the active layer and a second surface close to the active layer; the first capacitor electrode is in the same layer as the active layer of the thin film transistor, the array substrate further includes a buffer layer, where the buffer layer is between the second surface and the active layer; and the capacitor for fingerprint recognition includes a dielectric layer, where the dielectric layer includes a part of the base substrate and a part of the buffer layer.

In some embodiments, the first capacitor electrode includes a doped semiconductor material.

In some embodiments, in the same pixel, a distance between the first capacitor electrode and the active layer close to the first capacitor electrode is more than 1 micrometer.

In some embodiments, the base substrate includes a first surface away from the active layer and a second surface close to the active layer; the first capacitor electrode is in the same layer as the gate of the thin film transistor, and the array substrate further includes a buffer layer and a first gate insulating layer, where the buffer layer is between the second surface and the active layer, and the first gate insulating layer is between the active layer and the gate; and the capacitor for fingerprint recognition includes a dielectric layer, where the dielectric layer includes a part of the base substrate, a part of the buffer layer, and a part of the first gate insulating layer.

In some embodiments, in the same pixel, a distance between the first capacitor electrode and the gate close to the first capacitor electrode is more than 3 micrometers.

In some embodiments, the array substrate further includes a shielding layer between the base substrate and the active layer, and an orthographic projection of the shielding layer on the base substrate covers an orthographic projection of the active layer of the thin film transistor on the base substrate; and the fingerprint recognition structure further includes an excitation component, where the excitation component is configured to generate an excitation signal for fingerprint recognition, and the excitation component is in the same layer as the shielding layer.

In some embodiments, an orthographic projection of the excitation component on the base substrate surrounds an orthographic projection of the first capacitor electrode on the base substrate.

In some embodiments, the light-emitting unit includes an anode, a cathode, and a light-emitting layer interposed between the anode and the cathode, where the cathode is further away from the base substrate than the anode, the anode is a transparent anode, and the cathode is a reflective cathode.

In some embodiments, the thin film transistor further includes a source and a drain, where an orthographic projection of each of the active layer, the gate, the source, and the drain of the thin film transistor on the base substrate does not overlap with an orthographic projection of the first capacitor electrode on the base substrate.

In some embodiments, the array substrate further includes a first signal line and a second signal line, where the first signal line and the second signal line are configured to provide electrical signals to the pixel driver circuit respectively, the first signal line extends in a first direction, and the second signal line extends in a second direction; and an orthographic projection of each of the first signal line and the second signal line on the base substrate does not overlap with the orthographic projection of the first capacitor electrode on the base substrate.

In some embodiments, the second signal line is configured to provide a data signal to the pixel driver circuit; and the data signal is further provided to an excitation component.

In some embodiments, the base substrate includes a transparent material; and/or a thickness of the base substrate is between 5 micrometers and 20 micrometers; and/or a thickness of the buffer layer is between 1000 angstroms and 4000 angstroms.

In another aspect, a display panel is provided. The display panel includes the array substrate as described above.

In yet another aspect, a display apparatus is provided. The display apparatus includes the array substrate as described above or the display panel as described above.

In yet another aspect, a method for manufacturing an array substrate is provided, including:
providing a base substrate;
forming a fingerprint recognition structure on the base substrate, where the fingerprint recognition structure includes a first capacitor electrode, and the first capacitor electrode is configured to: form a capacitor for fingerprint recognition between at least a part of a touch body and the first capacitor electrode in response to the at least a part of the touch body covering the first capacitor electrode; and
forming a plurality of pixels on the base substrate, where the plurality of pixels are arranged on the base substrate in an array, and at least one of the plurality of pixels includes a pixel driver circuit and a light-emitting unit electrically connected to the pixel driver circuit,
where the fingerprint recognition structure is in the at least one pixel, the pixel driver circuit includes a thin film transistor, the thin film transistor includes an active layer and a gate, and the first capacitor electrode and one of the active layer of the thin film transistor or the gate of the thin film transistor are formed through the same patterning process.

BRIEF DESCRIPTION OF THE DRAWINGS

The above-described and/or additional aspects and advantages of the present disclosure will become apparent and readily understood from the following description of embodiments in conjunction with the accompanying drawings.

DETAILED DESCRIPTION OF EMBODIMENTS

Figure 1:
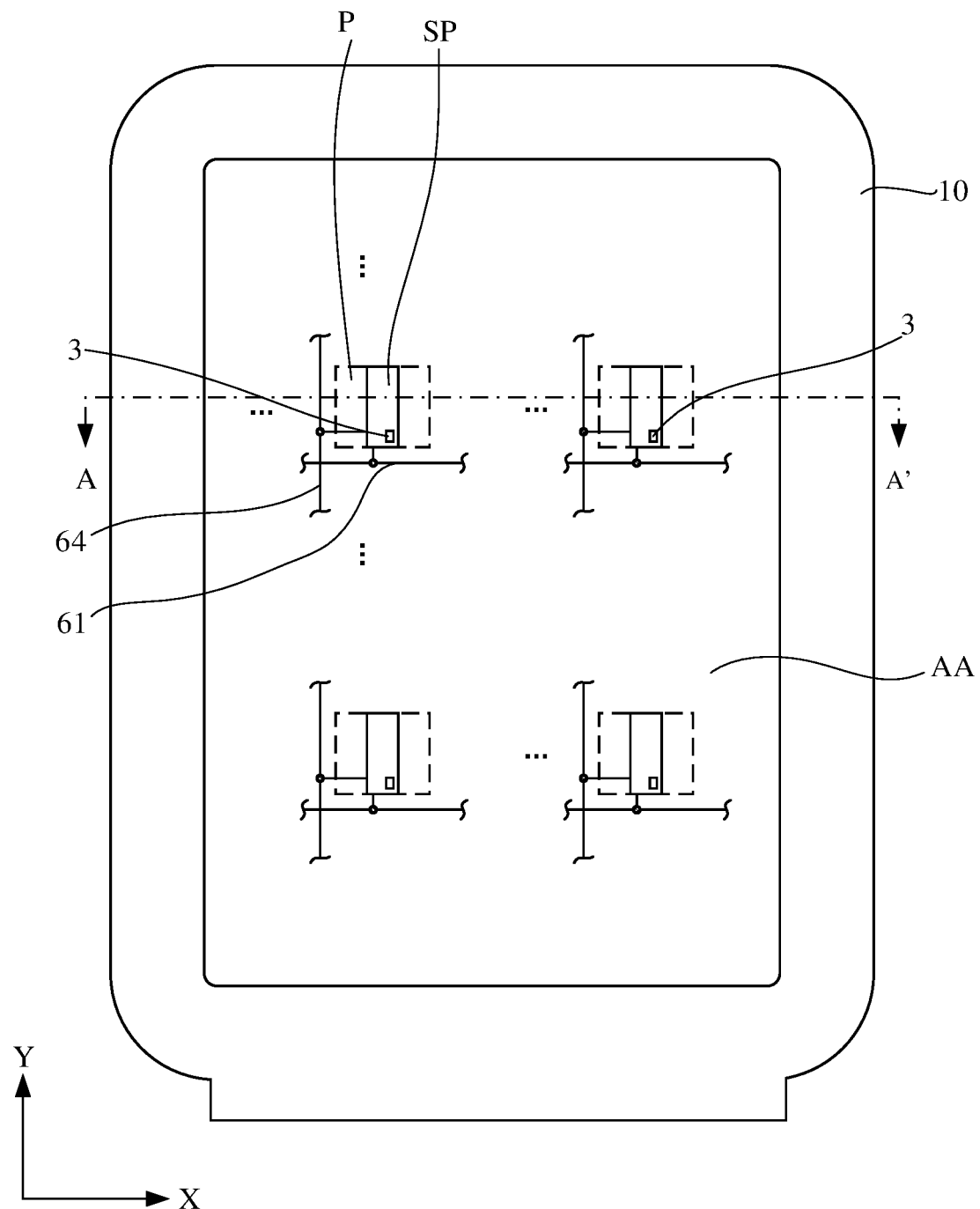
FIG. 1 shows a plan view of an array substrate according to some exemplary embodiments of the present disclosure.

In order to make the purposes, technical solutions and advantages of the embodiments of the present disclosure more apparent, the technical solutions of the embodiments of the present disclosure will be completely described below with reference to the drawings. It should be noted that the described embodiments are some, but not all embodiments of the present disclosure. Based on the described embodiments of the present disclosure, all other embodiments obtained by those of ordinary skill in the art without creative efforts fall within the protection scope of the present disclosure.

It should be noted that, in the drawings, a size and relative size of an element may be exaggerated for clarity and/or descriptive purposes. As such, dimensions and relative dimensions of the various elements are not necessarily limited to those shown in the drawings. In the specification and the drawings, the same or similar reference numerals refer to the same or similar parts.

When an element is described as being "on", "connected to", or "coupled to" another element, the element may be directly on the other element, directly connected to the other element or directly coupled to the other element, or intermediate elements may be present. However, when an element is described as being "directly on," "directly connected to," or "directly coupled to" another element, there is no intermediate element. Other terms and/or expressions used to describe the relationship between elements should be interpreted in a similar fashion. For example, "between" versus "directly between", "adjacent" versus "directly adjacent", "on" vs "directly on", or the like. Furthermore, the term "connected" may refer to a physical connection, an electrical connection, a communication connection, and/or a fluid connection. In addition, an X axis, a Y axis, and a Z axis are not limited to the three axes of the rectangular coordinate system, and may be interpreted in a broader sense. For example, the X axis, the Y axis, and the Z axis may be perpendicular to each other, or may represent different directions that are not perpendicular to each other. As used herein, the term "and/or" includes any combination and all combinations of one or more of the associated listed items.

It should be understood that although the terms "first", "second", etc. may be used herein to describe various parts, components, elements, regions, layers and/or sections, these parts, components, elements, regions, layers, and/or sections should not be limited by these terms. Rather, these terms are used to distinguish one part, component, element, region, layer, and/or section from another. Accordingly, for example, a first part, a first component, a first element, a first region, a first layer, and/or or a first section may be referred to as a second part, a second member, a second element, a second region, a second layer, and/or a second portion, without departing from the teachings of the present disclosure.

For ease of description, spatial relational terms such as "upper," "lower," "left," "right" may be used herein to describe the relationship of one element or feature to another element or feature as shown in the drawings. It should be understood that, the spatially relational terms are intended to encompass other different orientations of the apparatus in use or in operation, in addition to the orientation depicted in the drawings. For example, if the apparatus in the drawings is turned over, elements described as "below" or "beneath" other elements or features will then be oriented "above" or "on" the other elements or features.

It should be understood by those skilled in the art that, unless otherwise specified, the expression "height" or "thickness" as used herein refers to a dimension along a surface of each layer arranged perpendicular to the display panel. That is, a dimension along a light-emitting direction of the display panel, a dimension along a normal direction of the display apparatus, or a dimension along a Z direction in the drawings.

In this document, unless otherwise specified, the expression "patterning process" generally includes steps of coating a photoresist, exposing the photoresist, developing the photoresist, etching the photoresist, and stripping the photoresist. The expression "a patterning process" means a process of forming a patterned layer, a patterned feature, a patterned member, or the like, using a mask.

It should be noted that the expressions "same layer", "arranged in the same layer", or similar expressions refer to layer structure formed by using the same film forming process to form a film for forming a specific pattern, and then using the same mask to pattern the film through a patterning process. According to different specific patterns, a patterning process may include a plurality of exposure processes, development processes, or etching processes, and the specific patterns in the formed layer structure may be continuous or discontinuous. These specific patterns may also be at different heights or have different thicknesses.

As used herein, unless otherwise specified, the expression "electrically connected" may mean that two parts or elements are directly electrically connected. For example, a part or element A is in direct contact with a part or element B, and an electrical signal may be transmitted between the two. The expression "electrically connected" may also mean that two parts or elements are electrically connected through a conductive medium such as a conductive wire, for example, the part or element A is electrically connected to the part or element B through a conductive wire to transmit an electrical signal between the two parts or elements. The expression "electrically connected" may also mean that two parts or elements are electrically connected through at least one electronic component, for example, a component or element A is electrically connected to a component or element B through at least one thin film transistor to transmit an electrical signal between the two components or elements.

According to working principles, fingerprint recognition sensors may be divided into a plurality of types such as optical fingerprint sensors, capacitive fingerprint sensors, inductive fingerprint sensors, pressure-sensitive fingerprint sensors, thermal fingerprint sensors, ultrasonic scanning fingerprint sensors, and radio frequency fingerprint sensors.

For example, in an optical fingerprint sensor, when a touch body of a finger is placed on a substrate, light emitted from a built-in light source or a display unit is reflected by the finger and then projected onto the charge-coupled device (CCD), thereby forming a fingerprint image with multiple gray scales, which may be processed by a fingerprint recognition sensor. Since the light cannot pass through a surface layer of a skin (a dead skin layer), only a surface of the skin of the finger may be scanned, or the dead skin layer may be scanned but the light cannot reach the dermis. Therefore, the cleanliness of the surface of the finger has a direct impact on the results of fingerprint recognition.

For example, in a capacitive fingerprint sensor, when a touch body of a finger is placed on a substrate, the capacitive fingerprint sensor will measure a signal of a tiny conductivity change caused by a fingerprint, and then the measured data is used to form an image of the fingerprint. The outermost skin of the finger, also known as a fingerprint, is non-conductive, whereas a subcutaneous layer inside the fingerprint is conductive. As such, the capacitive fingerprint sensor has lower requirements on the cleanliness of the finger surface than the optical fingerprint sensor, and the capacitive fingerprint sensor may recognize a texture of an inner layer of the finger, thereby improving the security of fingerprint recognition.

Embodiments of the present disclosure at least provide an array substrate, a display panel, a display apparatus, and a method for manufacturing the array substrate. The array substrate includes: a base substrate; a plurality of pixels arranged on the base substrate, where the plurality of pixels are arranged on the base substrate in an array, and at least one of the plurality of pixels includes a pixel driver circuit and a light-emitting unit electrically connected to the pixel driver circuit; a fingerprint recognition structure, where the fingerprint recognition structure includes a first capacitor electrode, and the first capacitor electrode is configured to form a capacitor for fingerprint recognition between at least a part of a touch body and the first capacitor electrode, in response to the at least a part of the touch body covering the first capacitor electrode. The fingerprint recognition structure is in the at least one pixel, and the pixel driver circuit includes a thin film transistor, where the thin film transistor includes an active layer and a gate, and the first capacitor electrode is in the same layer as one of the active layer of the thin film transistor or the gate of the thin film transistor. In this way, the fingerprint recognition structure may be arranged within the pixel of the array substrate, thereby facilitating the integration of the fingerprint recognition structure into the display apparatus.

Figure 2:
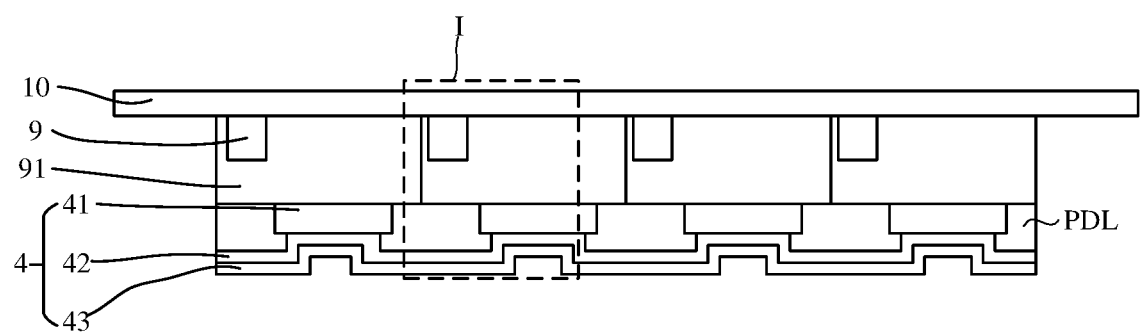
FIG. 2 shows a sectional view of an array substrate taken along the line AA' in FIG. 1 according to some exemplary embodiments of the present disclosure.

FIG. 1 shows a plan view of an array substrate according to some exemplary embodiments of the present disclosure. FIG. 2 shows a sectional view of an array substrate taken along the line AA' in FIG. 1, according to some exemplary embodiments of the present disclosure. Referring to FIGS. 1 and 2, the array substrate 1 may include a base substrate 10, for example, the base substrate 10 may be made of materials such as glass, plastic, polyimide, and the like. The base substrate 10 includes a display area AA, and a peripheral area (or a non-display area) NA on at least one side of the display area AA (for ease of description, the side is referred to as a first side).

With continued reference to FIG. 1, the array substrate 1 may include a plurality of pixel units P (which is schematically shown as dashed boxes in FIG. 1), and the plurality of pixel units P are arranged on the base substrate 10 in an array along a first direction X and a second direction Y. Each pixel unit P may further include a plurality of sub-pixels, such as a red sub-pixel, a green sub-pixel, and a blue sub-pixel. In FIG. 1, a sub-pixel SP is schematically shown.

For example, as shown in FIG. 1, the peripheral area NA may be on four sides of the display area AA, that is, the peripheral area NA surrounds the display area AA.

It should be noted that, in the drawings, the pixel unit and the sub-pixel are schematically shown in a rectangular shape, however, this does not constitute a limitation on shapes of the pixel unit and the sub-pixel included in the display panel provided by the embodiments of the present disclosure.

The array substrate 1 may further include a light-emitting unit 4, such as an OLED device. As shown in FIG. 2, the light-emitting unit 4 includes a first electrode 41, a second electrode 43 arranged opposite to the first electrode 41, and a light-emitting layer 42 arranged between the first electrode 41 and the second electrode 43.

One of the first electrode 41 or the second electrode 43 is an anode, and the other is a cathode. For example, the first electrode 41 may be a transparent anode, for example, it may be made of a transparent conductive material, where the transparent conductive material may include indium tin oxide (ITO), indium zinc oxide (IZO), etc. The second electrode 43 may be a reflective cathode, for example, it may be made of a metal material, where the metal material may include alloys such as a magnesium aluminum alloy (MgAl), a lithium aluminum alloy (LiAl), or single metals such as magnesium, aluminum, and lithium. The light-emitting layer 42 may have a multi-layer structure, for example, the light-emitting layer 42 may include a multi-layer structure formed by a hole injection layer, a hole transport layer, an organic light-emitting layer, an electron transport layer, and an electron injection layer.

It should be noted that, the light-emitting unit 4 may be actively driven or passively driven. The passively driven OLED array substrate may be composed of a cathode and an anode, where an intersection of the anode and the cathode may emit light, and the driver circuit may be externally mounted through connection methods such as a tape carrier package or a glass carrier chip. For the active driven OLED array substrate, each pixel may be provided with a pixel driver circuit, and the pixel driver circuit may include a thin film transistor with a switching function (i.e., a switching transistor), a thin film transistor with a driving function (i.e., a driver transistor), and a charge storage capacitor. In addition, the pixel driver circuit may further include other types of thin film transistors with a compensation function. It should be understood that, in the embodiments of the present disclosure, the display panel may be provided with various types of known pixel driver circuits, which will not be repeated here.

For example, as shown in FIG. 2, the array substrate 1 includes a driver circuit layer 9, and the above-mentioned pixel driver circuit may be provided in the driver circuit layer 9. An insulating layer 91 may be provided between the driver circuit layer 9 and the light-emitting unit 4, where the insulating layer 91 may be a single insulating film layer or a stacked structure composed of a plurality of insulating film layers.

The array substrate 1 may further include various signal lines arranged on the base substrate 10, where the various signal lines include a scan signal line, a data signal line, an ELVDD power supply line, an ELVSS power supply line, etc., so that various signals such as a control signal, a data signal, and a power supply voltage may be provided to the pixel driver circuit in each sub-pixel. In the embodiment shown in FIG. 1, the scan signal line 61 and the data signal line 64 are schematically shown. Scan signal lines 61 and data signal lines 64 may be electrically connected to respective sub-pixels. For example, the scan signal line 61 may substantially extend along the first direction X, for providing the pixel driver circuit with an electrical signal such as the scan signal; and the data signal lines 64 may substantially extend along the second direction Y, for providing an electrical signal such as the data signal to the pixel driver circuit.

A structure of the pixel driver circuit will be described in detail below by taking a 7T1C pixel driver circuit as an example. However, the embodiments of the present disclosure are not limited to the 7T1C pixel driver circuit, and without conflict, other known pixel driver circuit structures may be applied to the embodiments of the present disclosure.

Figure 3:
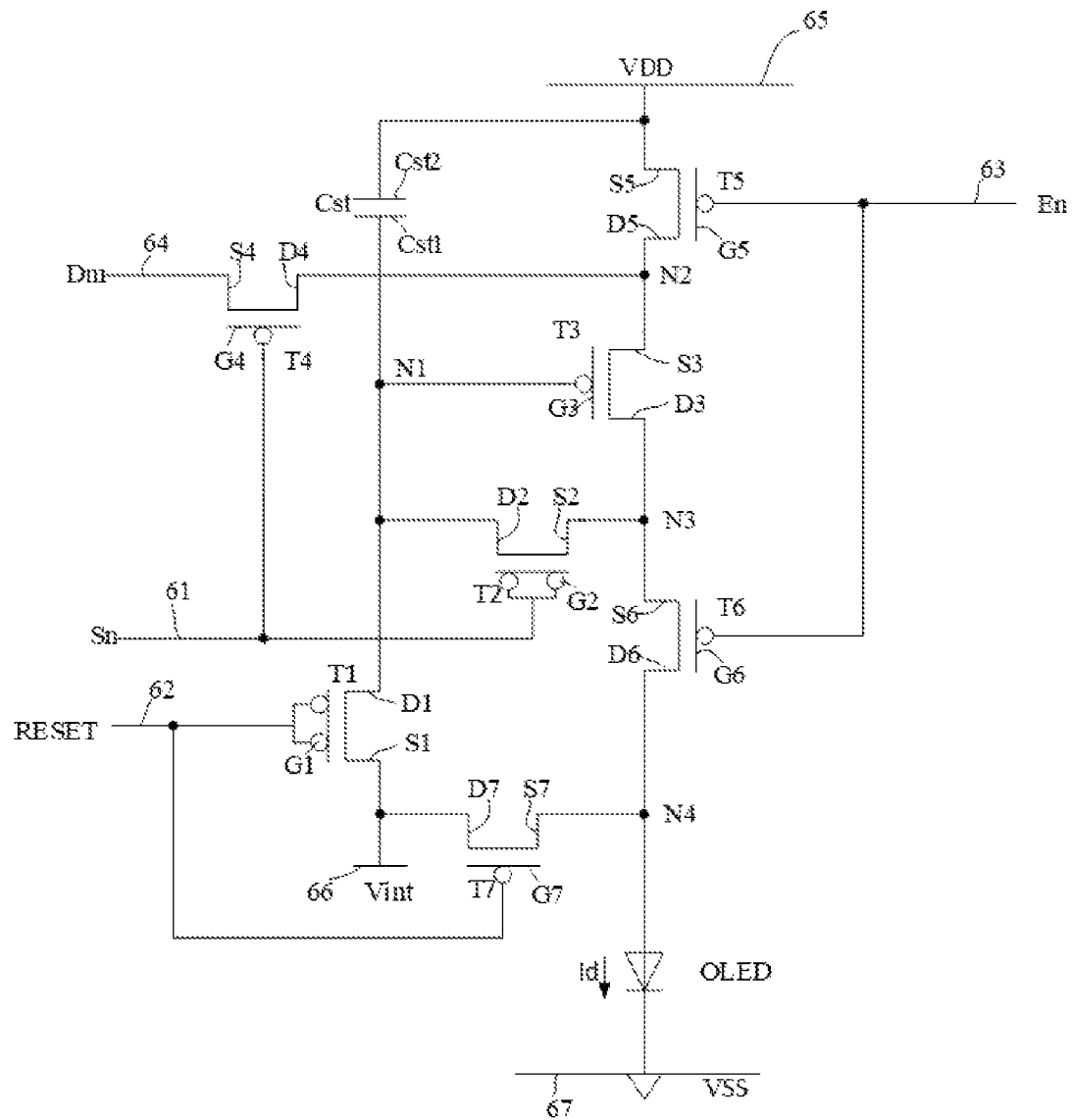
FIG. 3 shows an equivalent circuit diagram of a pixel driver circuit of a display substrate according to some exemplary embodiments of the present disclosure.

FIG. 3 is an equivalent circuit diagram of a pixel driver circuit of a display substrate according to some exemplary embodiments of the present disclosure. Referring to FIGS. 1 to 3 in combination, the pixel driver circuit may include a plurality of thin film transistors and a storage capacitor Cst. The pixel driver circuit is used for driving an organic light-emitting diode (i.e., an OLED). The plurality of thin film transistors include a first transistor T1, a second transistor T2, a third transistor T3, a fourth transistor T4, a fifth transistor T5, a sixth transistor T6, and a seventh transistor T7, where each transistor includes an active layer, a gate, a source, and a drain.

The display substrate may further include a plurality of signal lines, for example, the plurality of signal lines include: the scan signal line 61 for transmitting a scan signal Sn, a reset signal line 62 for transmitting a reset control signal RESET (for example, the reset control signal RESET may be a scan signal for a previous row), a light emission control line 63 for transmitting a light emission control signal En, the data signal line 64 for transmitting a data signal Dm, a driving voltage line 65 for transmitting a driving voltage VDD, an initialization voltage line 66 for transmitting an initialization voltage Vint, and a power supply line 67 for transmitting a reference voltage VSS.

The storage capacitor Cst may include two capacitor plates Cst1 and Cst2. Herein, the capacitor plate Cst1 may be referred to as one terminal, a first terminal, or a first storage capacitor electrode, of the storage capacitor Cst, and the capacitor plate Cst2 may be referred to as the other terminal, a second terminal, or a second storage capacitor electrode, of the storage capacitor Cst.

For example, the active layer of the thin film transistor may include, for example, polysilicon, and the active layer may include, for example, a channel region, a source region, and a drain region. The channel region may be undoped or doped differently from the source region and the drain region, and thus have semiconductor properties. The source region and the drain region are on both sides of the channel region, respectively, and are doped with impurities and thus have conductivity. The impurities may be different depending on whether the TFT is an N-type transistor or a P-type transistor.

A gate G1 of the first transistor T1 is electrically connected to the reset signal line 62, and a source S1 of the first transistor T1 is electrically connected to the initialization voltage line 66. A drain D1 of the first transistor T1 is electrically connected to the terminal Cst1 of the storage capacitor Cst, a drain D2 of the second transistor T2, and a gate G3 of the third transistor T3. As shown in FIG. 3, the drain D1 of the first transistor T1, the terminal Cst1 of the storage capacitor Cst, the drain D2 of the second transistor T2, and the gate G3 of the third transistor T3 are electrically connected to a node N1. The first transistor T1 is turned on in response to the reset control signal RESET transmitted through the reset signal line 62, so as to transmit the initialization voltage Vint to the gate G3 of the third transistor T3, thereby performing an initialization operation to initialize a voltage of the gate G3 of the third transistor T3. That is, the first transistor T1 is also referred to as an initialization transistor or a reset transistor herein.

A gate G2 of the second transistor T2 is electrically connected to the scan signal line 61, a source S2 of the second transistor T2 is electrically connected to a node N3, and the drain D2 of the second transistor T2 is electrically connected to the node N1. The second transistor T2 is turned on in response to the scan signal Sn transmitted through the scan signal line 61, so as to electrically connect the gate G3 of the third transistor T3 and the drain D3 of the third transistor T3 to each other, so that the third transistor T3 becomes diode-connected. The second transistor T2 is also referred to as a compensation transistor herein.

The gate G3 of the third transistor T3 is electrically connected to the node N1, a source S3 of the third transistor T3 is electrically connected to a node N2, and the drain D3 of the third transistor T3 is electrically connected to the node N3. The third transistor T3 receives the data signal Dm in response to a switching operation of the fourth transistor T4, so as to supply a driving current Id to the OLED. The third transistor T3 is also referred to as a driver transistor herein.

The fourth transistor T4 serves as a switching device for selecting a target sub-pixel to emit light. A gate G4 of the fourth transistor T4 is connected to the scan signal line 61, a source S4 of the fourth transistor T4 is connected to the data signal line 64 and a drain D4 of the fourth transistor T4 is connected to the first transistor T1 and the fifth transistor T5. That is, the drain D4 is electrically connected to the node N2. The fourth transistor T4 is turned on in response to the scan signal Sn transmitted through the scan signal line 61, so as to perform a switching operation to transmit the data signal Dm to the source S3 of the third transistor T3. The fourth transistor T4 is also referred to as a switching transistor herein.

A gate G5 of the fifth transistor T5 is electrically connected to the light emission control line 63, a source S5 of the fifth transistor T5 is electrically connected to the driving voltage line 65, and a drain D5 of the fifth transistor T5 is electrically connected to the node N2. The fifth transistor T5 is also referred to as an operation control transistor herein.

A gate G6 of the sixth transistor T6 is electrically connected to the light emission control line 63, a source S6 of the sixth transistor T6 is electrically connected to the node N3, and a drain D6 of the sixth transistor T6 is electrically connected to a node N4. That is, the sixth transistor T6 is electrically connected to the anode of the OLED. The fifth transistor T5 and the sixth transistor T6 are concurrently (e.g., simultaneously) turned on in response to the light emission control signal En transmitted through the light emission control line 63, so as to transmit the driving voltage VDD to the OLED, and thus the driving current Id is enabled to flow into the OLED. The sixth transistor T6 is also referred to as a light emission control transistor herein.

A gate G7 of the seventh transistor T7 is electrically connected to the reset signal line 62, a source S7 of the seventh transistor T7 is electrically connected to the node N4, and a drain D7 of the seventh transistor T7 is electrically connected to the initialization voltage line 66. Under the control of the seventh transistor T7, the initialization voltage Vint transmitted through the initialization voltage line 66 may be supplied to the OLED, e.g., to the first electrode (e.g., the anode) of the OLED, so as to initialize a voltage on the first electrode of the OLED. The seventh transistor T7 may also be referred to as a light-emitting device initialization transistor T7 herein.

The terminal Cst1 (hereinafter referred to as the first storage capacitor electrode) of the storage capacitor Cst is electrically connected to the node N1, and the other terminal Cst2 (hereinafter referred to as the second storage capacitor electrode) is electrically connected to the driving voltage line 65.

The anode of the OLED is electrically connected to the node N4, and the cathode of the OLED is electrically connected to the power supply line 67, so as to receive the reference voltage VSS. Accordingly, the OLED receives the driving current Id from the third transistor T3 to emit light, thereby displaying an image.

It should be noted that, in FIG. 3, the respective thin film transistors T1, T2, T3, T4, T5, T6, and T7 are P-channel field effect transistors. However, the embodiments of the present disclosure are not limited thereto, and at least some of the thin film transistors T1, T2, T3, T4, T5, T6, and T7 may be N-channel field effect transistors.

Figure 4:
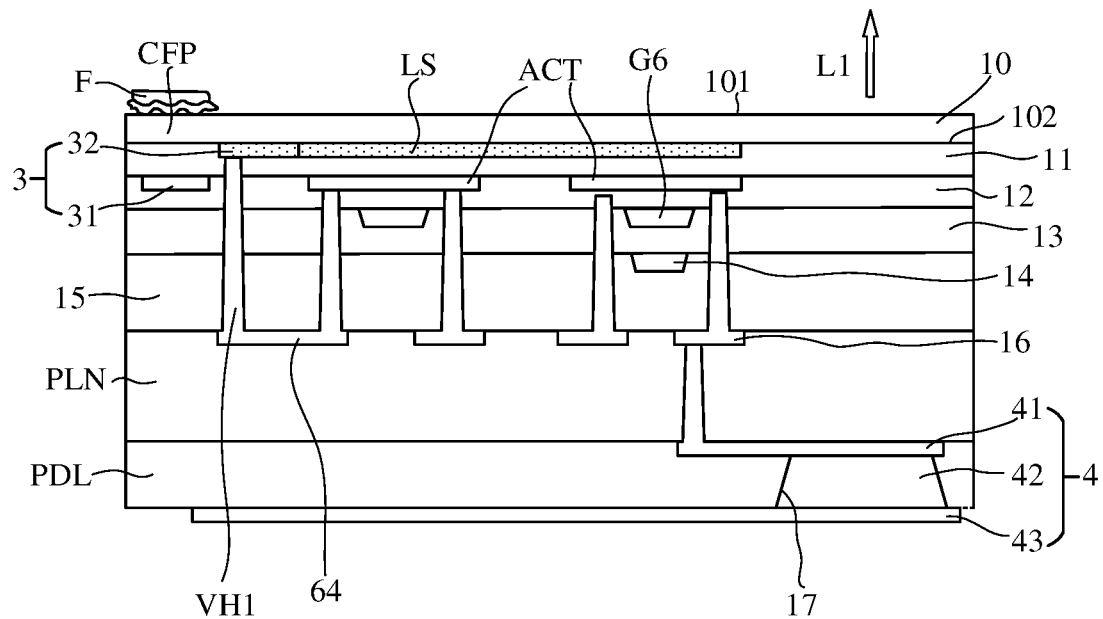
FIG. 4 shows a partial enlarged view of the part I of FIG. 2, which schematically shows a partial sectional view of an array substrate according to some exemplary embodiments of the present disclosure.

FIG. 4 is a partial enlarged view of the part I of FIG. 2, which schematically shows a partial sectional view of an array substrate according to some exemplary embodiments of the present disclosure. Referring to FIGS. 1 to 4, the array substrate 1 may include: the base substrate 10; the plurality of pixels P arranged on the base substrate 10, where the plurality of pixels P are arranged on the base substrate in an array, and at least one of the plurality of pixels P includes a pixel driver circuit and a light-emitting unit 4 electrically connected to the pixel driver circuit; the fingerprint recognition structure 3 including a first capacitor electrode 31, where the first capacitor electrode 31 is configured to form a capacitor CFP for fingerprint recognition between at least a part of a touch body and the first capacitor electrode 31 in response to the at least a part of the touch body F (e.g., a finger) covering the first capacitor electrode 31.

For example, the fingerprint recognition structure 3 is in the at least one pixel P, where the pixel driver circuit includes a thin film transistor (e.g., at least one of the above-mentioned transistors T1, T2, T3, T4, T5, T6, and T7). The thin film transistor includes an active layer ACT (e.g., an active layer of at least one of the above-mentioned transistors T1, T2, T3, T4, T5, T6, and T7) and a gate (e.g., at least one of the above-mentioned gates G1, G2, G3, G4, G5, G6, and G7 of the above-mentioned transistors), and the first capacitor electrode 31 is in the same layer as one of the active layer ACT of the thin film transistor or the gate of the thin film transistor. In the embodiments of the present disclosure, the electrode of the fingerprint recognition structure is in the same layer as the active layer of the thin film transistor or gate of the thin film transistor, which is conducive to the integration of the fingerprint recognition structure onto the array substrate and the integration of the fingerprint recognition structure into each pixel.

With continued reference to FIGS. 1 to 4, the array substrate 1 may further include a buffer layer 11 arranged on the base substrate 10. The active layer ACT is arranged on a side of the buffer layer 11 away from the base substrate 10. The array substrate 1 may further include a first gate insulating layer 12 arranged on a side of the active layer ACT away from the base substrate 10. The gates G1, G2, G3, G4, G5, G6, and G7 of the above-mentioned transistors are arranged on a side of the first gate insulating layer 12 away from the base substrate 10. That is, the first gate insulating layer 12 is between the active layer ACT and a conductive layer (which may be referred to as a first conductive layer) where each gate is located. Optionally, the array substrate 1 may further include a second gate insulating layer 13 and a second conductive layer 14. For example, the above-mentioned second storage capacitor electrode Cst2 may be in the second conductive layer 14. The second gate insulating layer 13 is between the above-mentioned first conductive layer and the second conductive layer 14. The array substrate 1 may further include: an interlayer dielectric layer 15 arranged on a side of the second conductive layer 14 away from the base substrate 10; a third conductive layer 16 arranged on a side of the interlayer dielectric layer 15 away from the base substrate 10; a planarization layer PLN arranged on a side of the third conductive layer 16 away from the base substrate 10; and a pixel defining layer PDL arranged on a side of the planarization layer PLN away from the base substrate 10. For example, the sources and drains of the respective transistors described above may be in the third conductive layer 16. The sources and the drains of the respective transistors may be electrically connected to source and drain regions of the respective active layers through via holes penetrating the first gate insulating layer 12, the second gate insulating layer 13, and the interlayer dielectric layer 15, respectively.

For example, the pixel defining layer PDL may include a plurality of openings 17, each sub-pixel corresponds to at least one opening 17 of the pixel defining layer, and an actual light-emitting region or display region of the sub-pixel is closely equal to an opening 17 of the pixel defining layer corresponding to the sub-pixel. In some embodiments, an area of the opening 17 of the pixel defining layer corresponding to each sub-pixel or an area of the actual light-emitting region corresponding to each sub-pixel is smaller than an area of the first electrode 41 (e.g., the anode), and an projection of the opening 17 or the actual light-emitting region on the base substrate 10 completely falls within an projection of the first electrode 41 on the base substrate 10.

Figure 6:
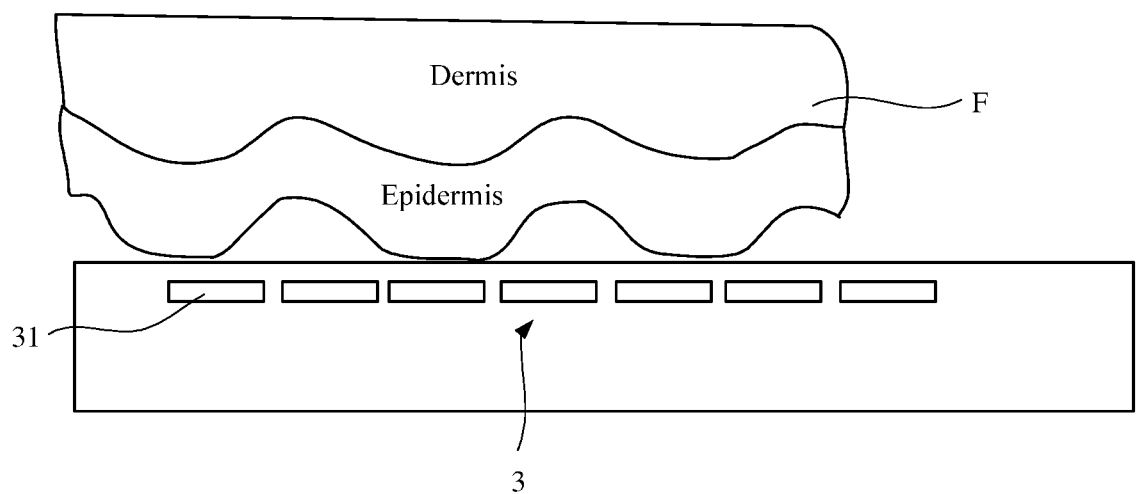
FIG. 6 shows a diagram of a principle of a capacitive fingerprint recognition technology applied to an array substrate according to an embodiment of the present disclosure.

FIG. 6 is a diagram shows a principle of a capacitive fingerprint recognition technology applied to an array substrate according to an embodiment of the present disclosure. Referring to FIG. 6, when a touch body F of, for example, a finger presses on the fingerprint recognition structure 3, the capacitor CFP for fingerprint recognition is formed between the first capacitor electrode 31 of the fingerprint recognition structure 3 and a fingerprint to be recognized of the finger. Due to an uneven surface of the fingerprint to be recognized, a distance between a ridge of the fingerprint to be recognized and the first capacitor electrode 31 is different from a distance between a valley of the fingerprint to be recognized and the first capacitor electrode 31, resulting in a capacitor CFP formed by the ridge of the fingerprint to be recognized and the first capacitor electrode 31 is different from a capacitor CFP formed by the valley of the fingerprint to be recognized and the first capacitor electrode 31. Correspondingly, there is difference between a signal of charge amount accumulated on each of the first capacitor electrodes 31 corresponding to the ridge of the fingerprint to be recognized and the valley of the fingerprint to be recognized. A signal acquisition circuit may read the signal of charge amount accumulated on each of the first capacitor electrodes 31, and then send the signal of charge amount to a processing circuit to recognize the fingerprint information.

For example, positions of the ridge and valley of the fingerprints to be recognized correspond to a fingerprint peak of the fingerprints to be recognized and a fingerprint valley of the fingerprints to be recognized, respectively.

Referring back to FIG. 4, in an embodiment of the present disclosure, the light-emitting unit 4 is of a bottom emission type. The first capacitor electrode 31 is on a side of the light-emitting unit 4 close to the base substrate 10. That is, the first capacitor electrode 31 is closer to the base substrate 10 than the light-emitting unit 4.

For example, in the light-emitting unit 4, the first electrode 41 may be a transparent anode, the second electrode 43 may be a reflective cathode, and the first electrode 41 is closer to the base substrate 10 than the second electrode 43. As shown in FIG. 4, when the light-emitting layer 42 emits light under the control of the pixel driver circuit, the light emitted by the light-emitting unit 4 is emitted in a direction towards the base substrate 10, as shown by the light L1 in FIG. 4.

For example, the base substrate 10 may include a transparent material, for example, a transparent PI material, which is beneficial for the light emitted by the light-emitting unit 4 to be emitted through the base substrate 10.

Referring to FIG. 4, the base substrate 10 may include a first surface 101 away from the active layer ACT (i.e., the upper surface in FIG. 4) and a second surface 102 (i.e., the lower surface in FIG. 4) close to the active layer ACT. It should be understood that the first surface 101 is a light-emitting surface. In the embodiment shown in FIG. 4, the first capacitor electrode 31 and the active layer ACT of the thin film transistor are in the same layer. In this way, when a touch body such as a finger presses the array substrate, with a part of the finger covering the first capacitor electrode 31, the capacitor CPF for fingerprint recognition may be formed between the finger and the first capacitor electrode 31. The capacitor CPF for fingerprint recognition includes a dielectric layer, where the dielectric layer may include a part of the base substrate 10 and a part of the buffer layer 11. That is, the parts of the base substrate 10 and the buffer layer 11 between the finger and the first capacitor electrode 31 forms the dielectric layer of the capacitor CPF. In this embodiment, there is a relatively small distance between the finger serving as one electrode of the capacitor CPF and the first capacitor electrode 31 serving as the other electrode of the capacitor CPF, so that the formed capacitor CPF has a relatively large value of capacitance, which is conducive to the subsequent fingerprint recognition.

For example, the first capacitor electrode 31 may include a doped semiconductor material, where the semiconductor material is conductive after being doped, so that the doped semiconductor material may be used as an electrode of a capacitor.

As shown in FIG. 4, orthographic projections of the first capacitor electrode 31 and each active layer ACT, which is in the same layer as the first capacitor electrode 31, on the base substrate do not overlap each other. That is, the first capacitor electrode 31 and each active layer ACT are in the same layer and spaced apart from each other. For example, in the same pixel, a distance between the first capacitor electrode 31 and the active layer ACT close to the first capacitor electrode 31 is more than 1 micrometer. In this way, adverse effects of the active layer ACT on the capacitor CPF may be avoided, which is conducive to the improvement of the accuracy of fingerprint recognition.

Figure 5:
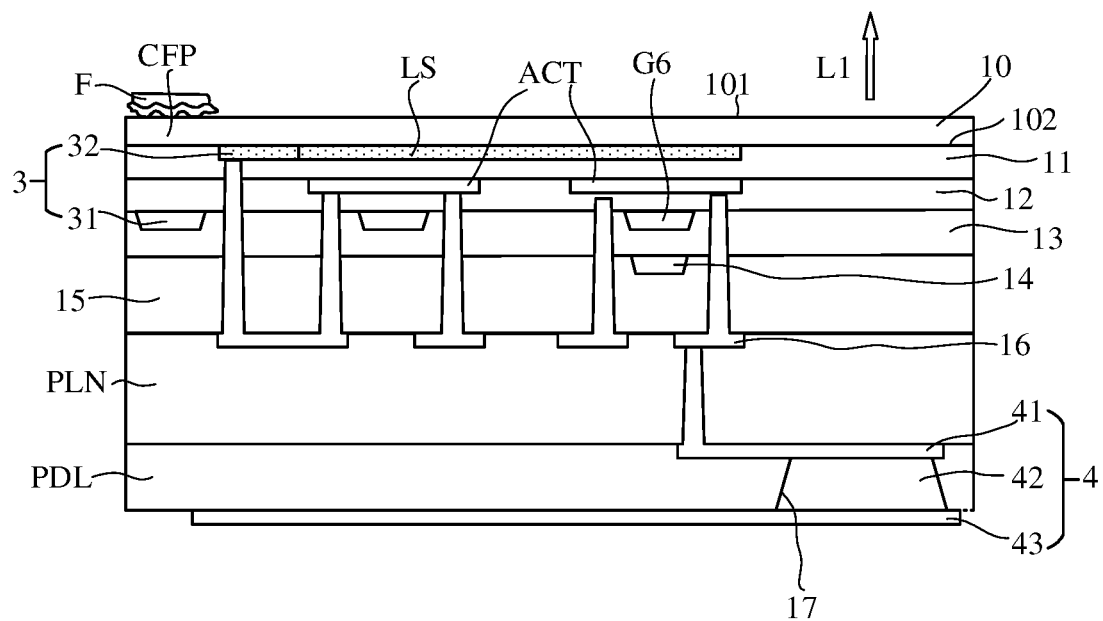
FIG. 5 shows a partial enlarged view of the part I of FIG. 2, which schematically shows a partial sectional view of an array substrate according to some exemplary embodiments of the present disclosure.

FIG. 5 is a partial enlarged view of the part I of FIG. 2, which schematically shows a partial sectional view of an array substrate according to some exemplary embodiments of the present disclosure. In the following, a difference between the embodiment shown in FIG. 5 and the above-mentioned embodiment will be mainly described, and for other similarities, reference may be made to the above description, which will not be repeated here.

Referring to FIG. 5, the first capacitor electrode 31 may be in the same layer as the gate of the thin film transistor (e.g., at least one of the gates G1, G2, G3, G4, G5, G6, and G7 of the above transistors). In this way, when a touch body such as a finger presses the array substrate, with a part of the finger covering the first capacitor electrode 31, the capacitor CPF for fingerprint recognition may be formed between the finger and the first capacitor electrode 31. The capacitor CPF for fingerprint recognition includes a dielectric layer, where the dielectric layer may include a part of the base substrate 10, a part of the buffer layer 11, and a part of the first gate insulating layer 12. That is, the parts of the base substrate 10, the buffer layer 11, and the first gate insulating layer 12 between the finger and the first capacitor electrode 31 forms the dielectric layer of the capacitor CPF. Due to a relatively small thickness of the first gate insulating layer 12, there is a relatively small distance between the finger serving as one electrode of the capacitor CPF and the first capacitor electrode 31 serving as the other electrode of the capacitor CPF in this embodiment, so that the formed capacitor CPF has a relatively large value of capacitance, which is conducive to the subsequent fingerprint recognition.

As shown in FIG. 5, orthographic projections of the first capacitor electrode 31 and each gate (e.g., the gates G1, G2, G3, G4, G5, G6, and G7 of the above transistors), which is in the same layer as the first capacitor electrode 31, on the base substrate do not overlap each other. That is, the first capacitor electrodes 31 and each gate are in the same layer and spaced apart from each other. For example, in the same pixel, a distance between the first capacitor electrode 31 and the gate close to the first capacitor electrode 31 is more than 3 micrometers. In this way, the adverse effect of the gate on the capacitor CPF may be avoided, which is conducive to the improvement of the accuracy of fingerprint recognition.

For example, in an embodiment of the present disclosure, a thickness of the base substrate is between 5 micrometers and 20 micrometers; and/or a thickness of the buffer layer is between 1000 angstroms and 4000 angstroms. A distance between the two electrodes of the capacitor CPF for fingerprint recognition may be relatively small through such thickness configuration, which is conducive to the improvement of the accuracy of fingerprint recognition.

Referring to FIGS. 4 and 5, in an embodiment of the present disclosure, the array substrate 1 may further include a shielding layer LS. For example, the shielding layer LS is between the base substrate 10 and the active layer ACT, and an orthographic projection of the shielding layer LS on the base substrate 10 covers an orthographic projection of the active layer ACT of the thin film transistor on the base substrate 10. In this way, the shielding layer LS may be used to protect the active layer ACT of the thin film transistor, preventing an active layer of each transistor of each sub-pixel in a pixel driver circuit from being affected by external light.

For example, the shielding layer LS may be made of an opaque metal material. The shielding layer LS may also include a semiconductor film such as amorphous silicon, polysilicon, or the like.

For example, the shielding layer LS may be connected to a fixed voltage, so as to prevent the shielding layer LS from being in a floating state (i.e., floating).

In an embodiment of the present disclosure, the fingerprint recognition structure 3 may further include an excitation component 32, where the excitation component 32 is configured to generate an excitation signal for fingerprint recognition. For example, the excitation component 32 is in the same layer as the shielding layer LS.

For example, the excitation component 32 and the shielding layer LS may be formed in one piece, that is, the excitation component 32 is a part extending continuously from the shielding layer LS. Optionally, the excitation component 32 and the shielding layer LS may be separate parts, that is, the excitation component 32 and the shielding layer LS are spaced apart.

It should be noted that the excitation component 32 may also have an antistatic function.

Figure 7:
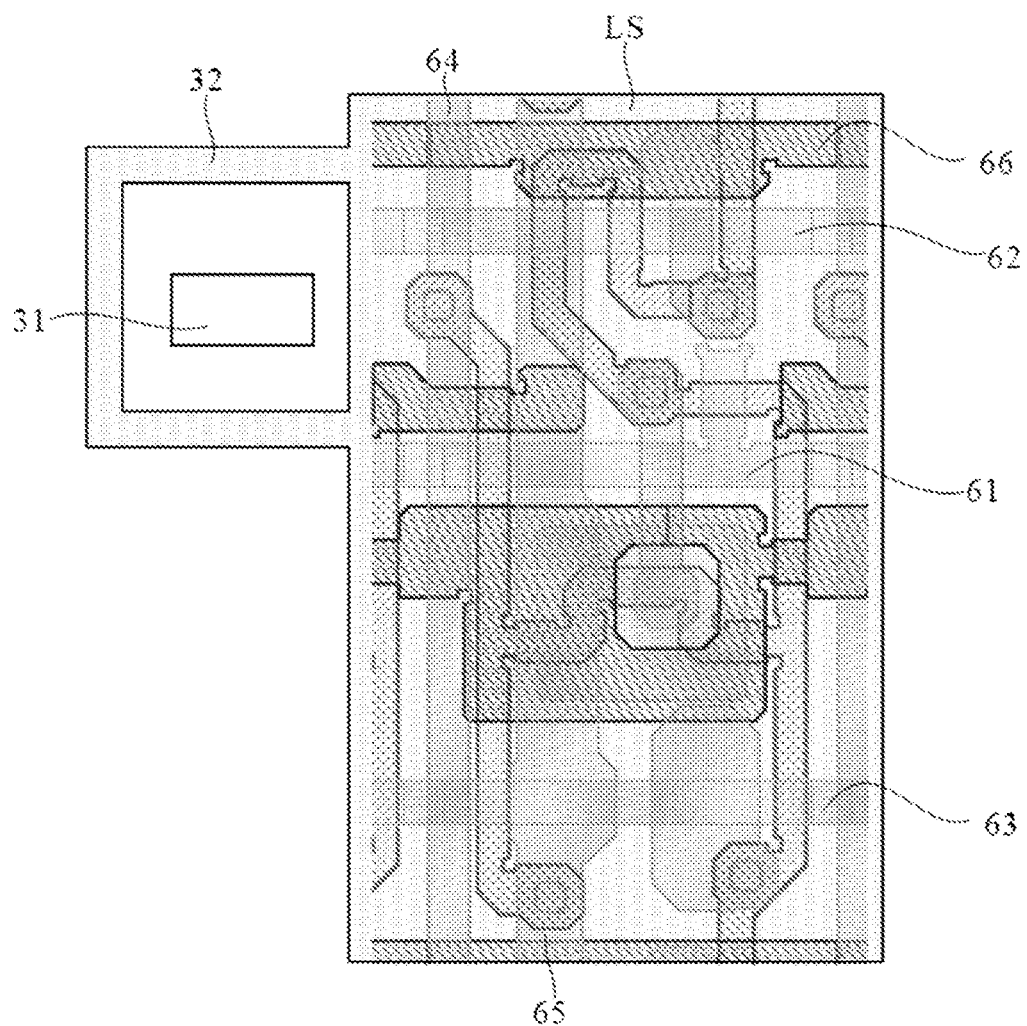
FIG. 7 shows a partial plan view of an array substrate according to some exemplary embodiments of the present disclosure, where a fingerprint recognition structure is schematically shown.

FIG. 7 is a partial plan view of an array substrate according to some exemplary embodiments of the present disclosure, where a fingerprint recognition structure is schematically shown. Referring to FIGS. 4, 5 and 7 in combination, an orthographic projection of the excitation component 32 on the base substrate 10 may surround an orthographic projection of the first capacitor electrode 31 on the base substrate 10. For example, the excitation component 32 is formed as a form of a metal ring.

For example, the excitation component 32 may be connected to a fixed voltage, so that the excitation component 32 may be configured to increase a voltage of the fingerprint to be recognized with the connected constant voltage. Therefore, a voltage difference between the fingerprint to be recognized and the first capacitor electrode 31 is increased, and a signal of charge amount of the capacitor CPF formed between the fingerprint to be recognized and the first capacitor electrode 31 is amplified, which may conductive to the improvement of the fingerprint recognition effect.

Referring to FIGS. 4 and 5, the excitation component 32 may be connected to the data signal Dm. For example, the excitation component 32 may be electrically connected to the data signal line 64 for transmitting the data signal Dm through a via hole VH1 penetrating the buffer layer 11, the first gate insulating layer 12, the second gate insulating layer 13, and the interlayer dielectric layer 15.

With continued reference to FIGS. 4, 5 and 7, in an embodiment of the present disclosure, an orthographic projection of each thin film transistor of the pixel driver circuit on the base substrate 10 does not overlap with the orthographic projection of the first capacitor electrode 31 on the base substrate 10. That is, an orthographic projection of each of the active layer, the gate, the source, and the drain of the thin film transistor on the base substrate 10 does not overlap with the orthographic projection of the first capacitor electrode 31 on the base substrate 10. In this way, the first capacitor electrode 31 will not overlap with each thin film transistor, thereby avoiding the generation of a coupling capacitor, which is conducive to the improvement of the fingerprint recognition effect.

Referring to FIG. 7, some signal lines are schematically shown. For example, the above-mentioned scan signal line 61 for transmitting the scan signal Sn, the reset signal line 62 for transmitting the reset control signal RESET (e.g., the reset control signal RESET may be a scan signal for a previous row), the light emission control line 63 for transmitting the light emission control signal En, the data signal line 64 for transmitting the data signal Dm, the driving voltage line 65 for transmitting the driving voltage VDD, and the initialization voltage line 66 for transmitting the initialization voltage Vint. Herein, for ease of description, a signal line extending in the first direction X may be referred to as a first signal line, and a signal line extending in the second direction Y may be referred to as a second signal line. For example, the first signal lines may include, but are not limited to, the scan signal line 61, the reset signal line 62, the light emission control line 63, and initialization voltage line 66; and the second signal lines may include, but are not limited to, the data signal lines 64 and the driving voltage lines 65. In an embodiment of the present disclosure, an orthographic projection of each of the first signal line and the second signal line on the base substrate 10 does not overlap with the orthographic projection of the first capacitor electrode 31 on the base substrate 10. In this way, the first capacitor electrode 31 will not overlap with each signal line, thereby avoiding the generation of a coupling capacitor, which is conducive to the improvement of the fingerprint recognition effect.

Referring to FIGS. 1 and 7 in combination, in an embodiment of the present disclosure, the array substrate 1 may include a plurality of the fingerprint recognition structures 3, where the plurality of fingerprint recognition structures 3 are arranged in the plurality of pixels P, respectively. That is, the fingerprint recognition structure 3 may be arranged within the pixel P, so that the fingerprint recognition structures 3 may be arranged in the plurality of pixels P, respectively, which is conducive to the realization of full-screen fingerprint recognition.

In the embodiments of the present disclosure, as described above, the light emitted by the light-emitting unit 4 is emitted in the direction toward the base substrate 10, as shown by the light L1 in FIGS. 4 and 5. That is, in actual use, the array substrate according to the embodiments of the present disclosure is inverted, with the light-emitting unit 4 located on a side away from the display surface (e.g., the upper surface in FIGS. 4 and 5). As a result, it is not necessary to provide an encapsulation layer (e.g., a thin film encapsulation layer) in the related art on a side of the light-emitting unit 4 away from the display surface, so that the manufacturing process may be simplified.

Figure 10:
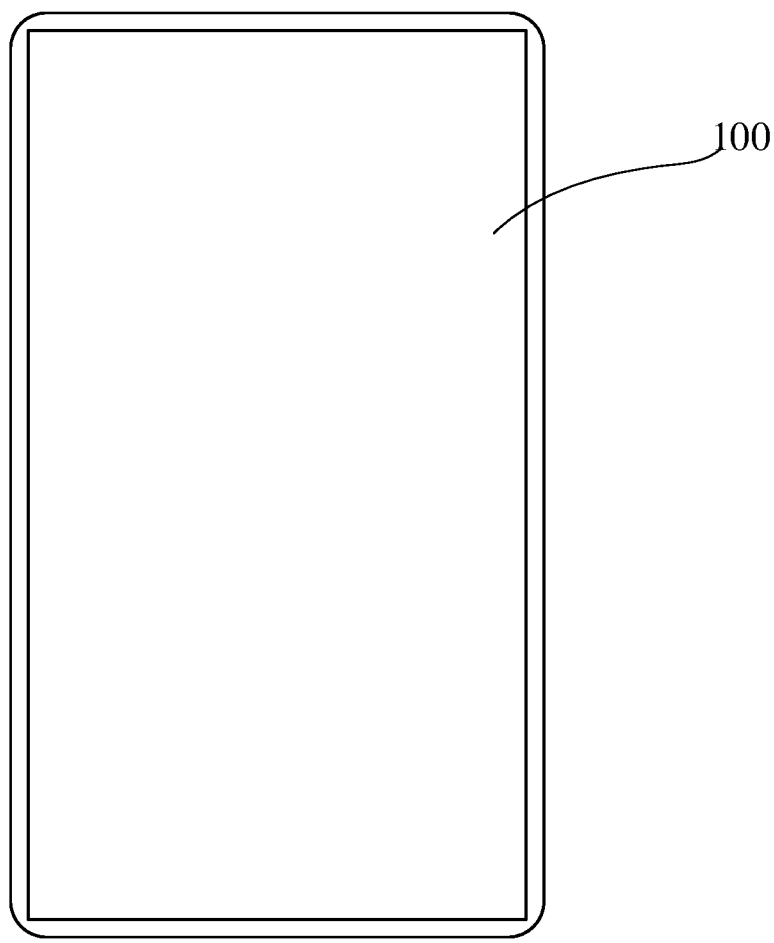
FIG. 10 shows a plan view of a display apparatus according to an embodiment of the present disclosure.

According to some embodiments of the present disclosure, a display panel and a display apparatus are further provided. The display panel may include the array substrate as described above. As shown in FIG. 10, which shows a plan view of a display apparatus according to an embodiment of the present disclosure, the display apparatus 100 may include an array substrate or a display panel according to some embodiments of the present disclosure. For example, the display apparatus according to the embodiments of the present disclosure may be any product or component with a display function, such as a smart phone, a wearable smart watch, smart glasses, a tablet computer, a television, a monitor, a laptop, a digital photo frame, a navigator, a car display, and an e-book. Advantageously, the display panel and the display apparatus according to the embodiments of the present disclosure may have all the features and advantages of the array substrate described above, which will not be repeated here.

Figure 8:
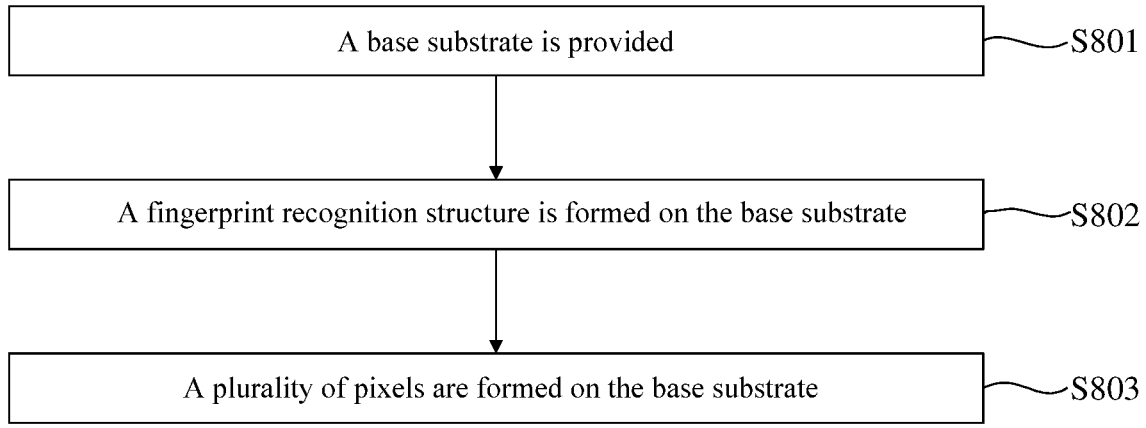
FIG. 8 shows a flowchart of a method for manufacturing an array substrate according to some exemplary embodiments of the present disclosure.

For example, some embodiments of the present disclosure further provide a method for manufacturing an array substrate. FIG. 8 shows a flowchart of a method for manufacturing an array substrate according to some exemplary embodiments of the present disclosure, and FIGS. 9A to 9D show sectional views of structures formed after some steps of a method for manufacturing an array substrate according to some exemplary embodiments of the present disclosure are performed. Referring to FIG. 8 and FIGS. 9A to 9D in combination, the manufacturing method may include the following steps.

In step S801, a base substrate 10 may be provided. For example, the base substrate 10 may be made of a transparent PI material.

In step S802, a fingerprint recognition structure 3 may be formed on the base substrate 10. The fingerprint recognition structure 3 may include a first capacitor electrode 31, where the first capacitor electrode 31 is configured to form a capacitor CPF for fingerprint recognition between at least a part of a touch body and the first capacitor electrode 31 in response to the at least a part of the touch body covering the first capacitor electrode 31.

In step S803, a plurality of pixels P are formed on the base substrate 10. The plurality of pixels P are arranged on the base substrate 10 in an array, and at least one of the plurality of pixels includes a pixel driver circuit and a light-emitting unit 4 electrically connected to the pixel driver circuit.

In an embodiment of the present disclosure, the fingerprint recognition structure 3 is in the at least one pixel P, where the pixel driver circuit includes a thin film transistor. The thin film transistor includes an active layer and a gate, and the first capacitor electrode 31 and one of the active layer ACT or the gate of the thin film transistor are formed through the same patterning process.

For example, referring to FIG. 4, the first capacitor electrode 31 and the active layer ACT of the thin film transistor are formed through the same patterning process. Referring to FIG. 5, the first capacitor electrode 31 and the gate of the thin film transistor are formed through the same patterning process.

Figure 9A:
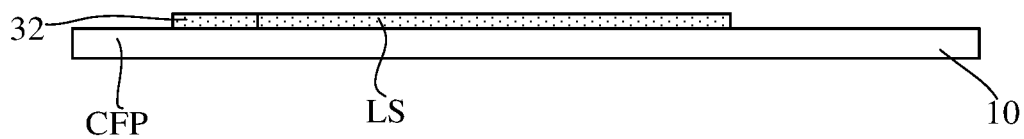
FIGS. 9A to 9D show sectional views of structures formed after some steps of a method for manufacturing an array substrate according to some exemplary embodiments of the present disclosure are performed.

For example, referring to FIG. 9A, a base substrate 10 with a thickness of 5 through to 10 micrometers may be prepared, and then the base substrate 10 may be pre-cleaned. Optionally, a barrier layer may be deposited on the base substrate 10 through a deposition process such as a PECVD process, for example, the barrier layer may be made of an insulating material such as silicon nitride, and a thickness of the barrier layer BRL may be between 1000 angstroms and 2000 angstroms.

With continued reference to FIG. 9A, a metal film may be formed on the base substrate 10 through a sputtering process, and then a shielding layer LS and an excitation component 32 may be formed through one patterning process. For example, the metal film layer may include molybdenum (Mo), aluminum (Al), and alloys thereof.

In the embodiment of the present disclosure, the excitation component 32 and the shielding layer LS are in the same layer, and thus may be prepared through the same patterning process, without increasing the number of patterning processes, which is conducive to simplifying the manufacturing process.

Figure 9B:
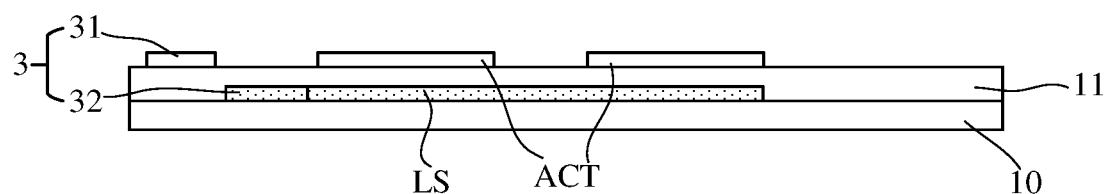

Referring to FIG. 9B, a buffer layer 11 may be formed on a side of the shielding layer LS away from the base substrate 10. For example, the buffer layer 11 may have a multi-layer structure. Specifically, a layer of silicon nitride may be deposited first, and then a layer of silicon oxide may be deposited, so as to form the buffer layer 11 including a stacked structure of silicon nitride and silicon oxide.

Then, the active layer ACT and the first capacitor electrode 31 are formed on a side of the buffer layer 11 away from the base substrate 10. For example, a plasma-enhanced chemical vapor deposition (PECVD) process may be used to deposit an amorphous silicon layer with a certain thickness; a heat treatment is performed on the amorphous silicon layer under a temperature of 400° C. to 450° C.; then an excimer laser annealing (ELA) process is performed; and then, an active layer ACT of each thin film transistor and the first capacitor electrode 31 are formed through another patterning process. After patterns of the active layer ACT and the first capacitor electrode 31 are formed, a doping process may be performed, so as to form a source region and drain region of each thin film transistor, and the first capacitor electrode with conductive properties.

Figure 9C:
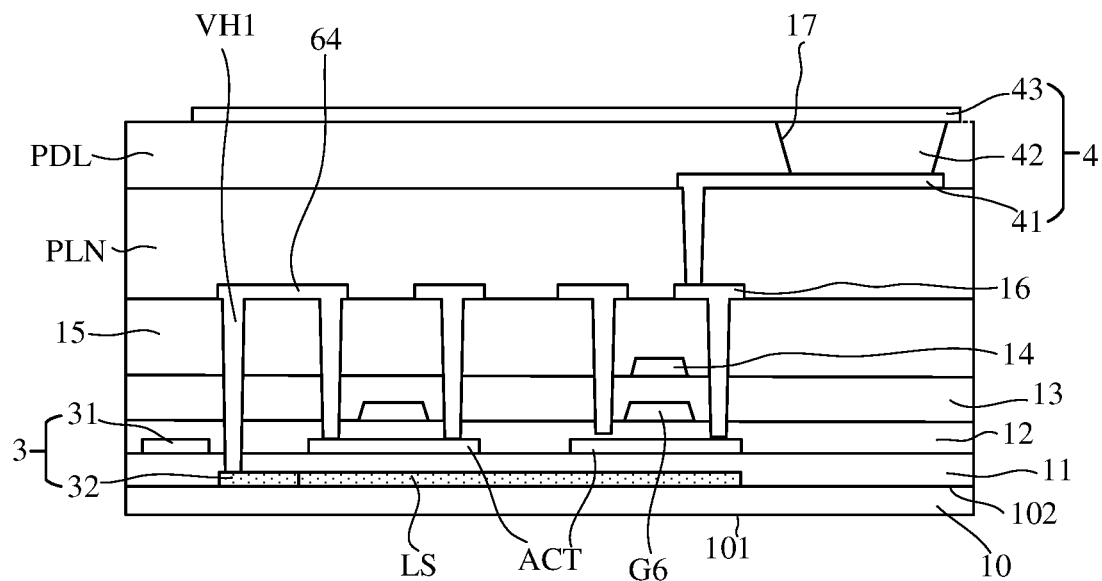

Referring to FIG. 9C, conventional processes for forming a thin film transistor and an OLED light-emitting unit may be used, so as to sequentially form respective film structures for forming the thin film transistor and the OLED light-emitting unit.

Figure 9D:
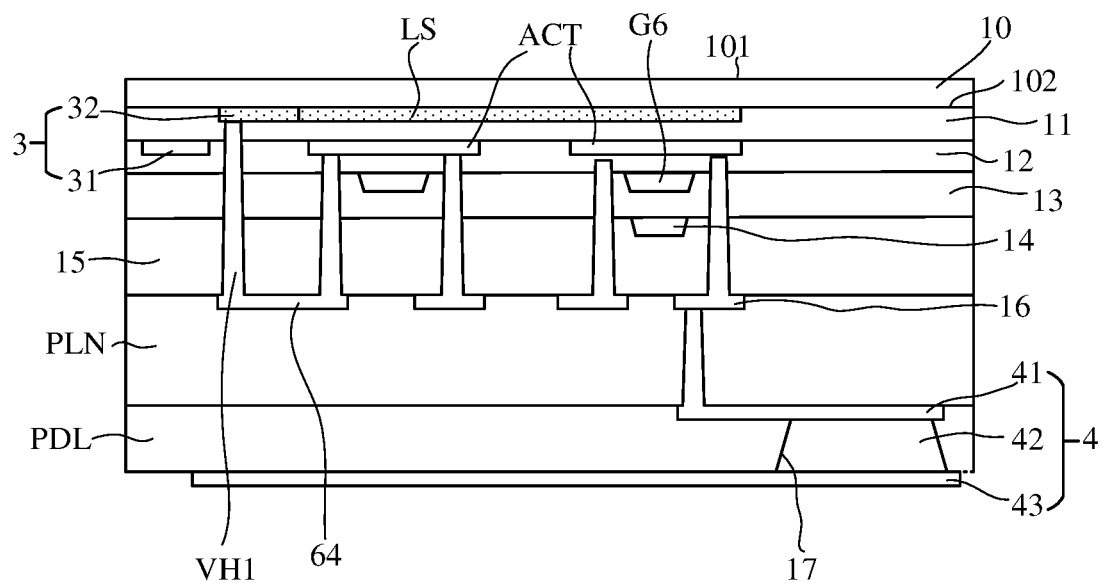

Referring to FIG. 9D, the formed structure shown in FIG. 9C is inverted, and the light-emitting unit 4 is of a bottom emission type. That is, when the light-emitting layer 42 emits light under the control of the pixel driver circuit, the light emitted by the light-emitting unit 4 is emitted in the direction toward the base substrate 10. In this way, when a touch body such as a finger presses the array substrate, the fingerprint recognition structure 3 may be closer to the finger, which is conducive to the improvement of the fingerprint recognition effect.

It should be noted that, referring to FIG. 5, in this embodiment, a gate of each thin film transistor and the first capacitor electrode 31 may be formed through the same patterning process.

Although some embodiments of the present general inventive concept have been illustrated and described, it will be understood by those of ordinary skill in the art that changes and modifications may be made to these embodiments without departing from the principles and spirit of the general concept of the present disclosure, the scope of which is defined by the claims and their equivalents.

What is claimed is:

1. An array substrate, comprising:
a base substrate;
a plurality of pixels arranged on the base substrate, wherein the plurality of pixels are arranged on the base substrate in an array, and at least one of the plurality of pixels comprises a pixel driver circuit and a light-emitting unit electrically connected to the pixel driver circuit; and
a fingerprint recognition structure, comprising a first capacitor electrode configured to form a capacitor for fingerprint recognition between at least a part of a touch body and the first capacitor electrode in response to the at least a part of the touch body covering the first capacitor electrode,
wherein the fingerprint recognition structure is in the at least one pixel, the pixel driver circuit comprises a thin film transistor, the thin film transistor comprises an active layer and a gate, and the first capacitor electrode is in the same layer as one of the active layer of the thin film transistor and or the gate of the thin film transistor.

2. The array substrate according to claim 1, wherein the first capacitor electrode is on a side of the light-emitting unit close to the base substrate.

3. The array substrate according to claim 1, wherein the array substrate comprises a plurality of fingerprint recognition structures, and the plurality of fingerprint recognition structures are arranged in the plurality of pixels, respectively.

4. The array substrate according to claim 1, wherein:
the base substrate comprises a first surface away from the active layer and a second surface close to the active layer;
the first capacitor electrode is in the same layer as the active layer of the thin film transistor, and the array substrate further comprises a buffer layer, wherein the buffer layer is between the second surface and the active layer; and
the capacitor for fingerprint recognition comprises a dielectric layer, wherein the dielectric layer comprises a part of the base substrate and a part of the buffer layer.

5. The array substrate according to claim 4, wherein the first capacitor electrode comprises a doped semiconductor material.

6. The array substrate according to claim 4, wherein in a same pixel, a distance between the first capacitor electrode and the active layer close to the first capacitor electrode is more than 1 micrometer.

7. The array substrate according to claim 4, wherein:
the base substrate comprises a transparent material; and/or
a thickness of the base substrate is between 5 micrometers and 20 micrometers; and/or
a thickness of the buffer layer is between 1000 angstroms and 4000 angstroms.

8. The array substrate according to claim 1, wherein:
the base substrate comprises a first surface away from the active layer and a second surface close to the active layer;
the first capacitor electrode is in the same layer as the gate of the thin film transistor, and the array substrate further comprises a buffer layer and a first gate insulating layer, wherein the buffer layer is between the second surface and the active layer, and the first gate insulating layer is between the active layer and the gate; and
the capacitor for fingerprint recognition comprises a dielectric layer, wherein the dielectric layer comprises a part of the base substrate, a part of the buffer layer, and a part of the first gate insulating layer.

9. The array substrate according to claim 8, wherein in a same pixel, a distance between the first capacitor electrode and the gate close to the first capacitor electrode is more than 3 micrometers.

10. The array substrate according to claim 1, wherein:
the array substrate further comprises a shielding layer between the base substrate and the active layer, and an orthographic projection of the shielding layer on the base substrate covers an orthographic projection of the active layer of the thin film transistor on the base substrate; and
the fingerprint recognition structure further comprises an excitation component, wherein the excitation component is configured to generate an excitation signal for fingerprint recognition, and the excitation component is in the same layer as the shielding layer.

11. The array substrate according to claim 10, wherein an orthographic projection of the excitation component on the base substrate surrounds an orthographic projection of the first capacitor electrode on the base substrate.

12. The array substrate according to claim 1, wherein the light-emitting unit comprises an anode, a cathode, and a light-emitting layer interposed between the anode and the cathode, wherein the cathode is further away from the base substrate than the anode, the anode is a transparent anode, and the cathode is a reflective cathode.

13. The array substrate according to claim 1, wherein the thin film transistor further comprises a source and a drain, wherein an orthographic projection of each of the active layer, the gate, the source, and the drain of the thin film transistor on the base substrate does not overlap with an orthographic projection of the first capacitor electrode on the base substrate.

14. The array substrate according to claim 13, wherein:
the array substrate further comprises a first signal line and a second signal line, wherein the first signal line and the second signal line are configured to provide electrical signals to the pixel driver circuit, respectively, the first signal line extends in a first direction, and the second signal line extends in a second direction; and an orthographic projection of each of the first signal line and the second signal line on the base substrate does not overlap with the orthographic projection of the first capacitor electrode on the base substrate.

15. The array substrate according to claim 14, wherein:
the second signal line is configured to provide a data signal to the pixel driver circuit; and
the data signal is further provided to an excitation component.

16. A display panel, comprising the array substrate according to claim 1.

17. A display apparatus, comprising the display panel according to claim 16.

18. A display apparatus, comprising the array substrate according to claim 1.

19. A method for manufacturing an array substrate, comprising:
providing a base substrate;
forming a fingerprint recognition structure on the base substrate, wherein the fingerprint recognition structure comprises a first capacitor electrode, and the first capacitor electrode is configured to form a capacitor for fingerprint recognition between at least a part of a touch body and the first capacitor electrode in response to the at least a part of the touch body covering the first capacitor electrode; and
forming a plurality of pixels on the base substrate, wherein the plurality of pixels are arranged on the base substrate in an array, and at least one of the plurality of pixels comprises a pixel driver circuit and a light-emitting unit electrically connected to the pixel driver circuit,
wherein the fingerprint recognition structure is in the at least one pixel, the pixel driver circuit comprises a thin film transistor, the thin film transistor comprises an active layer and a gate, and the first capacitor electrode and one of the active layer of the thin film transistor and or the gate of the thin film transistor are formed through the same patterning process.

* * * * *